US008872325B2

(12) United States Patent
Watanabe (10) Patent No.: US 8,872,325 B2
(45) Date of Patent: Oct. 28, 2014

(54) SEMICONDUCTOR DEVICE INCLUDING AN INSULATING LAYER AND HEAT SINK PLATES FORMED IN THE INSULATING LAYER

(75) Inventor: Yuji Watanabe, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 132 days.

(21) Appl. No.: 13/317,018

(22) Filed: Oct. 7, 2011

(65) Prior Publication Data

US 2012/0098115 A1 Apr. 26, 2012

(30) Foreign Application Priority Data

Oct. 25, 2010 (JP) .................................. 2010-238648

(51) Int. Cl.
| | | |
|---|---|---|
| H01L 23/48 | (2006.01) | |
| H01L 21/56 | (2006.01) | |
| H01L 23/433 | (2006.01) | |
| B29C 45/14 | (2006.01) | |
| H01L 25/065 | (2006.01) | |
| H01L 23/31 | (2006.01) | |
| H01L 23/00 | (2006.01) | |

(52) U.S. Cl.
CPC .......... H01L 25/0657 (2013.01); H01L 21/565 (2013.01); H01L 2924/01029 (2013.01); H01L 23/4334 (2013.01); H01L 2225/06562 (2013.01); H01L 2225/06506 (2013.01); H01L 2224/32145 (2013.01); B29C 45/14655 (2013.01); H01L 2924/1815 (2013.01); H01L 2224/45144 (2013.01); H01L 2224/73265 (2013.01); H01L 2225/06589 (2013.01); B29C 45/14827 (2013.01); H01L 2924/014 (2013.01); H01L 21/566 (2013.01); H01L 24/45 (2013.01); H01L 2225/0651 (2013.01); H01L 2224/48227 (2013.01); H01L 2924/01005 (2013.01); H01L 2924/01006 (2013.01); H01L 2224/92247 (2013.01); B29C 2045/14663 (2013.01); H01L 2224/32225 (2013.01); H01L 2224/48145 (2013.01); H01L 2224/73203 (2013.01); H01L 2924/01033 (2013.01); H01L 2224/16225 (2013.01); H01L 2924/01014 (2013.01); H01L 2224/48465 (2013.01); H01L 2924/01079 (2013.01); H01L 2224/48228 (2013.01); H01L 2924/01038 (2013.01); H01L 24/48 (2013.01); H01L 2224/48091 (2013.01); H01L 2224/97 (2013.01); H01L 23/3128 (2013.01); H01L 2924/15311 (2013.01); B29C 45/14065 (2013.01); H01L 24/97 (2013.01); H01L 2224/85207 (2013.01); H01L 2224/73204 (2013.01)
USPC .................................. 257/690; 257/E23.051

(58) Field of Classification Search
CPC ................. H01L 2924/00; H01L 2224/48227; H01L 2224/32225; H01L 2224/48091; H01L 2924/00014; H01L 2924/15311; H01L 2924/00012; H01L 2224/97; H01L 2224/48247; H01L 2224/32145
USPC .................. 257/690, 706, E23.051, E23.018
See application file for complete search history.

(56) References Cited

U.S. PATENT DOCUMENTS

| 6,143,590 | A * | 11/2000 | Ohki et al. ..................... 438/122 |
|---|---|---|---|
| 6,294,831 | B1 * | 9/2001 | Shishido et al. .............. 257/729 |
| 2004/0140546 | A1 * | 7/2004 | Lee et al. ....................... 257/686 |
| 2005/0104194 | A1 * | 5/2005 | Weng et al. .................... 257/706 |
| 2007/0086168 | A1 * | 4/2007 | Khanna et al. ................ 361/719 |
| 2008/0007920 | A1 * | 1/2008 | Shiraki et al. ................. 361/717 |

FOREIGN PATENT DOCUMENTS

JP         2004-096094 A     3/2004

* cited by examiner

Primary Examiner — Duy T Nguyen
(74) Attorney, Agent, or Firm — McGinn IP Law Group, PLLC (57) ABSTRACT

A semiconductor device has a substrate, a semiconductor chip mounted on the substrate, an encapsulating body encapsulating the semiconductor chip on the substrate, and a plurality of heat sink plates embedded in the encapsulating body so as to have a surface that is exposed to an exterior of the encapsulating body and positioned on the same plane. The heat sink plates are spaced from each other.

26 Claims, 5 Drawing Sheets

SEMICONDUCTOR DEVICE INCLUDING AN INSULATING LAYER AND HEAT SINK PLATES FORMED IN THE INSULATING LAYER

This application is based upon and claims the benefit of priority from Japanese patent application No. 2010-238648, filed on Oct. 25, 2010, the disclosure of which is incorporated herein in its entirety by reference.

BACKGROUND OF THE INVENTION

The present invention relates to a semiconductor device and a method of manufacturing a semiconductor device, and more particularly to a semiconductor device having heat sink plates embedded in an encapsulating body so as to have a surface exposed to the exterior of the encapsulating body and a method of manufacturing such a semiconductor device.

One of the related semiconductor devices has a wiring substrate, a semiconductor chip mounted on the wiring substrate, an encapsulating resin for encapsulating the semiconductor chip on the wiring substrate, and a heat sink plate embedded in the encapsulating resin or body so as to have a surface exposed to the exterior of the encapsulating body. Such a semiconductor device is manufactured as follows.

First, a wiring substrate on which a semiconductor chip has been mounted is set onto a lower mold of a molding apparatus. A heat sink plate is set onto an upper mold of the molding apparatus. At that time, the heat sink plate is attracted to an inner surface of a cavity of the upper mold by vacuum suction.

Then the wiring substrate is clamped by the upper mold and the lower mold. A resin is filled into the cavity.

Finally, a partially finished product integrated by the resin is removed from the molds. External terminals and the like are attached to the partially finished product. Thus, a semiconductor device is completed.

For example, JP-A 2004-96094 discloses such a semiconductor device and a method of manufacturing such a semiconductor device.

SUMMARY

In the manufacturing process of the related semiconductor device, a molding process is performed in a state in which the heat sink plate is held by suction. Therefore, if heat generated during the molding process causes thermal expansion of the heat sink plate, distortion may be cause in the heat sink plate. If distortion is caused in the heat sink plate, the heat sink plate may be brought into contact with a wire that connects the semiconductor chip and the wiring substrate to each other, causing some deficiencies such as a short circuit.

It is, therefore, the present invention seeks to solve one or more of above problems, or to improve upon those problems at least in part.

In one embodiment, there is provided a semiconductor device which has a substrate, a semiconductor chip mounted on the substrate, an encapsulating body encapsulating the semiconductor chip on the substrate, and a plurality of heat sink plates embedded in the encapsulating body so as to have a surface that is exposed to an exterior of the encapsulating body and positioned on the same plane. The heat sink plates are spaced from each other.

In another embodiment, there is provided a semiconductor device which includes a semiconductor chip; an insulating layer covering the semiconductor chip, the insulating layer including a top surface; and a plurality of metal plates disposed on the insulating layer, a surface of the metal plates being exposed from the top surface of the insulating layer.

In still another embodiment, there is provided a semiconductor device which includes a substrate including a top surface and a plurality of connection pads formed on the top surface; a first semiconductor chip including a first surface and a plurality of first electrode pads formed on the first surface, and mounted over the top surface of the substrate, the first electrode pads being electrically coupled to corresponding ones of the connection pads of the substrate; a second semiconductor chip including a second surface and a plurality of second electrode pads formed on the second surface, and stacked over the first semiconductor chip, the second electrode pads being electrically coupled to corresponding ones of the connection pads of the substrate; an insulating layer provided over the top surface of the substrate to cover the first semiconductor chip and the second semiconductor chip, the insulating layer including an exposed surface; and a plurality of metal plates embedded in the insulating layer such that a surface of the metal plates exposes from the exposed surface.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
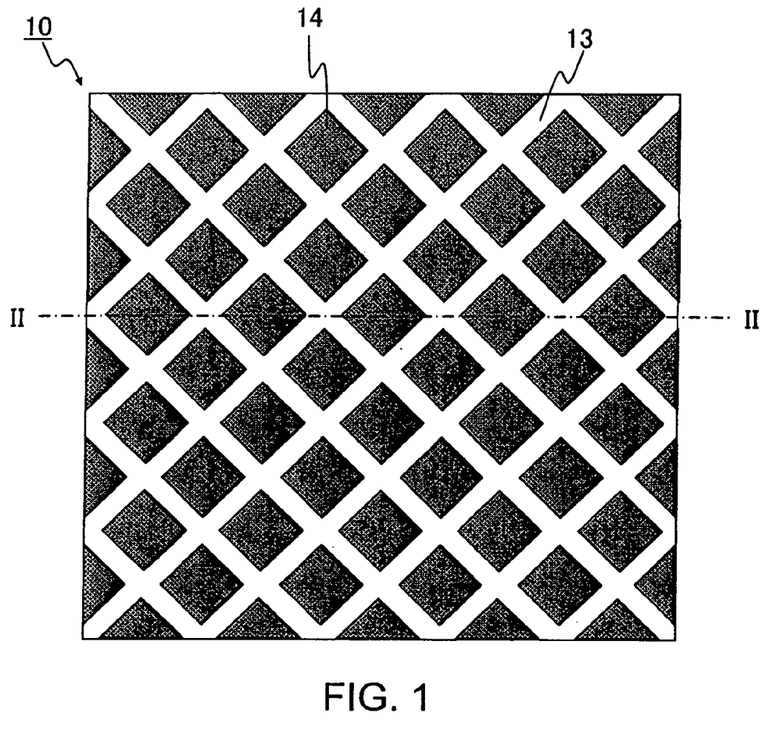
FIG. 1 is a plan view of a semiconductor device according to a first embodiment of the present invention.
Figure 2:
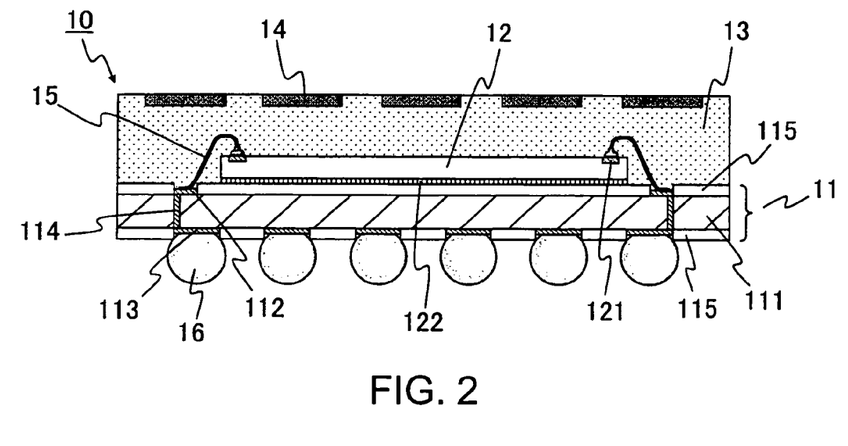
FIG. 2 is a cross-sectional view taken along line II-II of FIG. 1.

FIG. 1 is a plan view of a semiconductor device 10 according to a first embodiment of the present invention, and FIG. 2 is a cross-sectional view taken along line II-II of FIG. 1. In this embodiment, the semiconductor device 10 is a ball grid array (BGA) type semiconductor device. However, the invention is applicable to various types.

As shown in FIG. 2, the semiconductor device 10 has a wiring substrate 11, a semiconductor chip 12 mounted on the wiring substrate 11, an encapsulating body 13 encapsulating the semiconductor chip 12 on the wiring substrate 11, and a plurality of heat sink plates 14 embedded in the encapsulating body 13 so as to have a surface exposed to the exterior of the encapsulating body 13. The semiconductor device 10 also includes wires 15 for electrically connecting the wiring substrate 11 to the semiconductor chip 12 and solder balls 16 for mounting the wiring substrate 11 onto a circuit board (not shown).

The wiring substrate 11 includes an insulating substrate 111 having a rectangular shape in the plan view. For example, the insulating substrate 111 is made of glass epoxy. One or more wiring layers are formed on both of a first surface and a second surface of the insulating substrate 111 (an upper surface and a lower surface of the insulating substrate 111 in FIG. 2). A wiring layer (the uppermost wiring layer) on the first surface of the insulating substrate 111 includes a plurality of connection pads 112 to which the wires 15 are respectively connected. A wiring layer (the lowermost wiring layer) on the second surface of the insulating substrate 111 includes a plurality of lands 113 on which the solder balls 16 are respectively mounted. The wiring layer(s) on the first surface of the insulating substrate 111 is connected to the wiring layer(s) on the second surface of the insulating substrate 111 via penetrating wires 114, which extend through the insulating substrate 111. Surfaces of the wiring substrate 11 are covered with an insulating film (solder resist (SR)) 115 in an area other than the connection pads 112 and the lands 113 on both sides of the wiring substrate 11. The wiring substrate 11 is used to electrically connect electrode pads 121 of the semiconductor chip 12 to the corresponding solder balls 16.

In the plan view, the semiconductor chip 12 has a shape that has substantially the same size as the wiring substrate 11 or has a size smaller than the wiring substrate 11. For example, the semiconductor chip 12 includes a substrate made of silicon, one or more devices (not shown) formed on a surface of the silicon substrate (a device formation surface), and a plurality of electrode pads 121. The electrode pads 121 are formed along four sides or a pair of sides of the semiconductor chip 12. Furthermore, the device formation surface of the semiconductor chip 12 is covered with a passivation film (not shown) in an area other than the electrode pads 121. For example, the semiconductor chip 12 may be a semiconductor memory chip such as a dynamic random access memory (DRAM) chip. As the device configuration (circuit configuration) of the semiconductor chip 12 does not relate to the present invention, the semiconductor chip 12 may adopt any device configuration.

The semiconductor chip 12 is bonded and fixed to the wiring substrate 11 by an adhesive member 122, such as a die attach film (DAF) or an adhesive agent, in a state in which a surface opposite to the device formation surface faces the wiring substrate 11. Each of the electrode pads 121 is electrically connected to the corresponding connection pad 112 by the wire 15, which is made of a conductive metal such as gold.

For example, the encapsulating body 13 is made of an insulating thermosetting resin such as epoxy resin. The encapsulating body 13 is used to encapsulate the semiconductor chip 12 on the wiring substrate 11 along with the wires 15. The encapsulating body 13 also covers the electrode pads 121 and the connection pads 112 so as to protect them from external moisture, dust, and the like. The encapsulating body 13 is formed by a molding process. At that time, a plurality of heat sink plates 14 are integrated with the encapsulating body 13 (into the semiconductor device 10).

The heat sink plates 14 are metal plates having a high thermal conductivity, such as Cu. As shown in FIG. 1, each of the heat sink plates 14 has a rectangular shape (rhombus or square) in the plan view. The heat sink plates 14 are arranged on one side of the semiconductor device 10 in a state in which they are spaced from each other at predetermined intervals, like a mesh. Those heat sink plates 4 are embedded in the encapsulating body 13 so that their exposed surfaces are positioned on the same plane. The shape, the size, and the arrangement intervals of the heat sink plates 14 can be determined based upon the coefficient of thermal expansion of the heat sink plates 14 or the like. For this determination, it is preferable to consider the coefficient of thermal expansion of other elements such as the encapsulating body 13.

As described above, the semiconductor device 10 has a plurality of heat sink plates 14 arranged above the semiconductor chip 12. Therefore, heat generated at the semiconductor chip 12 is transferred to the heat sink plates 14 via the encapsulating body 13 and emitted from the heat sink plates 14 to the exterior of the semiconductor device 10.

The total area of the externally exposed surfaces of the heat sink plates 14 may be smaller than an area of the externally exposed surface of the heat sink plate of the related semiconductor device, which is hereinafter referred to as a single-type heat sink plate. However, an area of the heat sink plates 14 that is held in contact with the encapsulating body 13 is equivalent to or larger than that of the single-type heat sink plate in consideration of the thickness of the heat sink plates 14 (areas of their side surfaces). Therefore, the heat sink plates 14 demonstrate a thermal radiation capability equivalent to that of the single-type heat sink plate.

Furthermore, use of a plurality of heat sink plates 14 can disperse deformation or distortion during a molding process, so that deficiencies of the semiconductor device 10 can be prevented or reduced.

Moreover, since the predetermined intervals are provided between the adjacent heat sink plates 14, stress caused to the encapsulating body 13 by thermal expansion of the heat sink plates 14 can be reduced as compared to stress caused by thermal expansion of the single-type heat sink plate.

Additionally, the semiconductor device 10 has a structure in which the heat sink plates 14 are partially embedded in the encapsulating body 13. Therefore, the adhesiveness (bonding strength) between the heat sink plates 14 and the encapsulating body 13 can be improved based upon the shape and the bonding area of the heat sink plates 14.

Now a method of manufacturing the semiconductor device 10 will be described in detail with reference to FIGS. 3A to 3F.

Figure 3A:
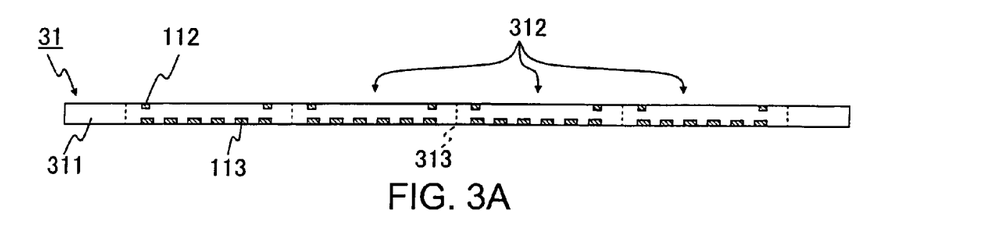
FIGS. 3A to 3F are process charts explanatory of a manufacturing process of the semiconductor device shown in FIGS. 1 and 2.

First, a base wiring substrate 31 is prepared as shown in FIG. 3A. For example, the base wiring substrate 31 is a glass epoxy wiring substrate having a thickness of 0.2 mm. The base wiring substrate 31 has a peripheral frame portion 311 and a plurality of product formation portions 312 (e.g., 4×4 product formation portions) arranged inside of the frame portion 311. The base wiring substrate 31 is cut along dicing lines 313 to separate the product formation portions 312 from each other. Each of the product formation portions 312 corresponds to one wiring substrate 11. As described in connection with FIG. 2, each of the product formation portions 312 has wiring layers, a plurality of connection pads 112, and a plurality of lands 113 formed thereon.

Figure 3B:
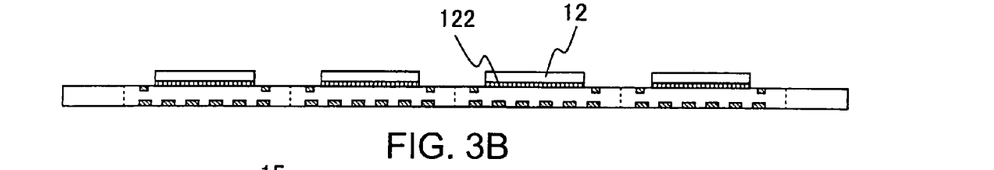

Then, as shown in FIG. 3B, semiconductor chips 12 are respectively mounted on the product formation portions 312 of the base wiring substrate 31 being prepared. For example, the semiconductor chips 12 may be mounted on the base wiring substrate 31 by using a die bonding apparatus.

When a die bonding apparatus is used, the base wiring substrate 31 is set at a predetermined position of the bonding apparatus in a state in which a surface of the base wiring substrate 31 having the connection pads 112 formed thereon faces upward. The die bonding apparatus places the semiconductor chips 12, to which adhesive members 122 such as DAFs have been attached or applied, at predetermined positions above the surface of the base wiring substrate 31 being set. Then the die bonding apparatus hardens the adhesive members 122 by heating or the like. As a result, the semiconductor chips 12 are respectively bonded and fixed to the product formation portions 312 of the base wiring substrate 31.

Figure 3C:
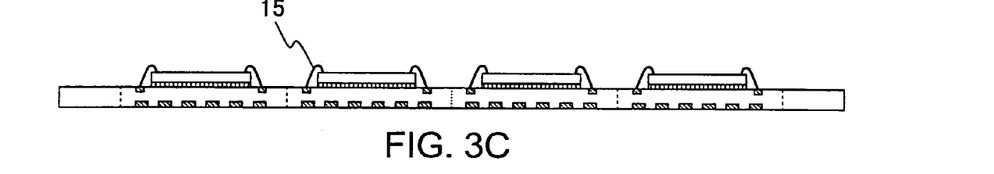

Subsequently, as shown in FIG. 3C, electrode pads 121 of the semiconductor chips 12 are connected to the corresponding connection pads 112 of the base wiring substrate 31 by wires 15. For example, a wire bonding apparatus may be used for the connection of the wires 15.

When the base wiring substrate 31 on which the semiconductor chips 12 have been mounted is set in place, the wire bonding apparatus connects and fixes an end of a metal wire such as a gold wire to the electrode pad 121 by ultrasonic thermo-compression bonding or the like. Then the wire bonding apparatus routes the metal wire in a looped form, and connects and fixes a portion of the metal wire that is to be the other end of the wire 15 to the connection pad 112 by ultrasonic thermo-compression bonding or the like. The wire bonding apparatus removes the rest of the metal wire from the portion connected and fixed the connection pad 112. Thus, the electrode pad 121 and the corresponding connection pad 112 are connected by the wire 15. An end of the removed metal wire is rounded or conglobated for the next wire bonding by heating and melting.

Figure 3D:
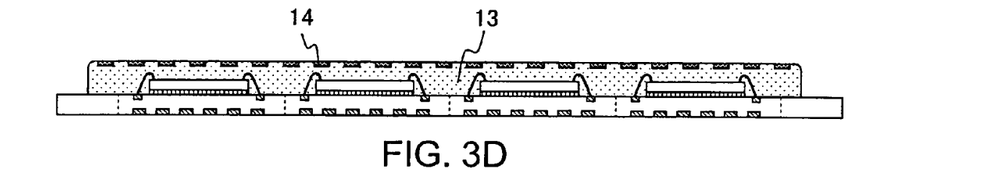

Next, as shown in FIG. 3D, the semiconductor chips 12 are encapsulated along with the wires 15 by an encapsulating body 13. At that time, a plurality of heat sink plates 14 are partially embedded in the encapsulating body 13 so as to have a surface exposed to the exterior of the encapsulating body 13. The encapsulating process (molding process) will be described later in detail with reference to FIGS. 4A-4D.

Figure 3E:
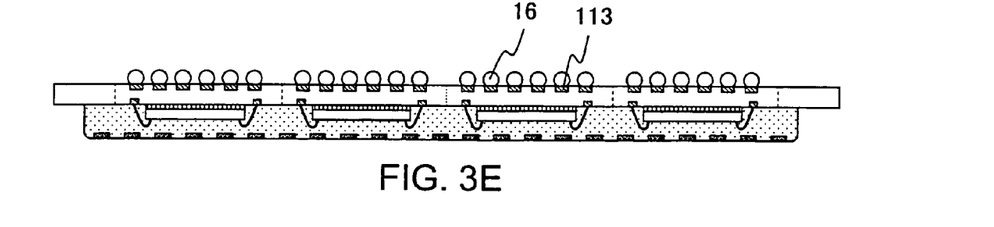

Then, as shown in FIG. 3E, solder balls 16 are mounted on the lands 113, respectively. In FIG. 3E, the base wiring substrate 31 with the encapsulating body 13 is upside down. The solder balls 16 may be mounted by using a suction mechanism having a plurality of suction holes arranged so as to correspond to the lands 113, for example. In such a case, a flux is applied to or printed on the lands 113, and the solder balls 16 attracted and held by the suction mechanism are mounted on the lands 113 at a time. Thereafter, the solder balls 16 and the lands 113 are bonded to each other by a reflow process. The solder balls 16 are used as bump electrodes (external terminals).

Figure 3F:
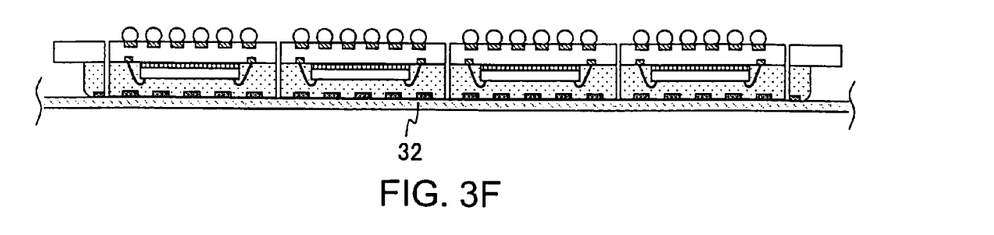

Next, as shown in FIG. 3F, the partially finished product having the solder balls 16 mounted thereon is attached to a dicing tape 32 in a state in which the surface of the partially finished product having the heat sink plates 14 arranged thereon faces the dicing tape 32. Then the base wiring substrate 31, the encapsulating body 13, and the heat sink plates 14 are cut along the dicing lines 313. Thus, the partially finished product is divided and separated into a plurality of semiconductor devices 10. For example, the partially finished product may be cut by using a dicing apparatus having dicing blades.

Finally, the separated semiconductor devices 10 are picked up from the dicing tape 32 by a pickup apparatus or the like.

In this manner, the semiconductor devices 10 are manufactured.

Figure 4A:
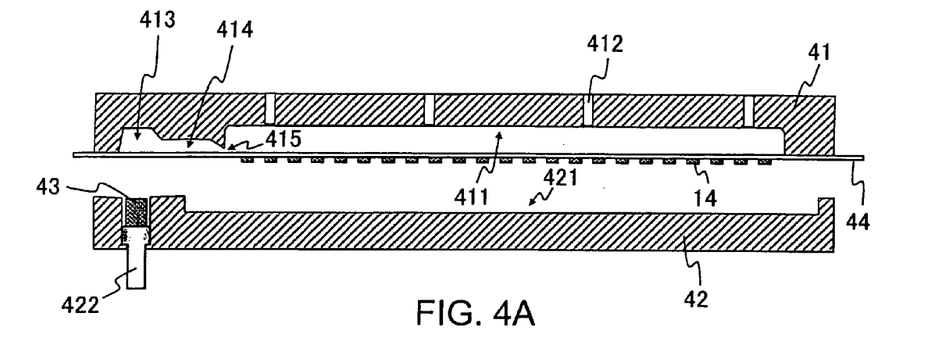
FIGS. 4A to 4D are process charts explanatory of a molding process of forming a structure shown in FIG. 3C into a structure shown in FIG. 3D.

Next, the encapsulating process of the encapsulating body 13 will be described below with reference to FIGS. 4A to 4D. For example, the encapsulating process may be performed by using a transfer molding method. As shown in FIG. 4A, a molding apparatus for a transfer molding has a first mold (upper mold) 41 and a second mold (lower mold) 42, which jointly form a molding tool.

The upper mold 41 has a cavity 411 formed on a surface that faces the lower mold 42. Furthermore, the upper mold 41 has discharge holes 412 for evacuating the interior of the cavity 411. The upper mold 41 also has a cull portion 413, a liner portion 414, and a gate portion 415.

Furthermore, the lower mold 42 has a recessed portion 421 formed on a surface that faces the upper mold 41. The lower mold 42 also has a plunger 422 for pushing a resin tablet 43, which is a raw material of the encapsulating body 13, into the cull portion 413.

In order to perform an encapsulating process with use of such a molding tool, a laminated sheet (or a support sheet) 44 is first positioned between the upper mold 41 and the lower mold 42. A plurality of heat sink plates 14 are arranged on and attached to a surface of the laminated sheet 44 at predetermined intervals (see FIG. 1). The laminated sheet 44 is positioned in such a state that the surface of the laminated sheet 44 having the heat sink plates 14 attached thereto faces the lower mold 42.

Then the interior of the cavity 411 is evacuated through the discharge holes 412 by a vacuum apparatus (not shown). When the interior of the cavity 411 is evacuated, the laminated sheet 44 being set is attracted and deformed so as to conform to the shape of the upper mold 41. As a result, the laminated sheet 44 is brought into close contact with the upper mold 41. Thus, the heat sink plates 14 are positioned on an inner surface (bottom) of the cavity 411.

The base wiring substrate 31 on which the semiconductor chips 12 have been mounted is positioned within the recessed portion 421 of the lower mold 42. At that time, the base wiring substrate 31 is arranged so that the semiconductor chips 12 face the upper mold 41.

Figure 4B:
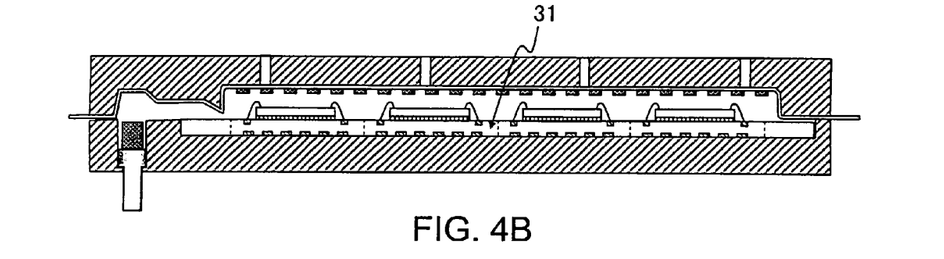

Then the upper mold 41 and the lower mold 42 are closed into a state illustrated in FIG. 4B. Specifically, the heat sink plates 14 face the semiconductor chips, and a space is defined between the heat sink plates 14 and the semiconductor chips for filling a molten resin therein. In this manner, a resin fill space having a predetermined size is formed above the base wiring substrate 31. The resin fill space may be referred to as a cavity. At that time, a portion of the laminated sheet 44 is held between the upper mold 41 and the lower mold 42. Therefore, the adhesiveness of the upper mold 41 and the lower mold 42 is improved so as to prevent or reduce a leakage of the encapsulating resin from the molding tool.

Next, a resin tablet 43 is supplied to a pot (an upper portion of the plunger 422). The resin tablet 43 is then heated and melted. The molten encapsulating resin is pushed by the plunger 422 and injected from the cull portion 413 through the liner portion 414 and the gate portion 415 into the cavity 411 (between the base wiring substrate 31 and the laminated sheet 44).

Figure 4C:
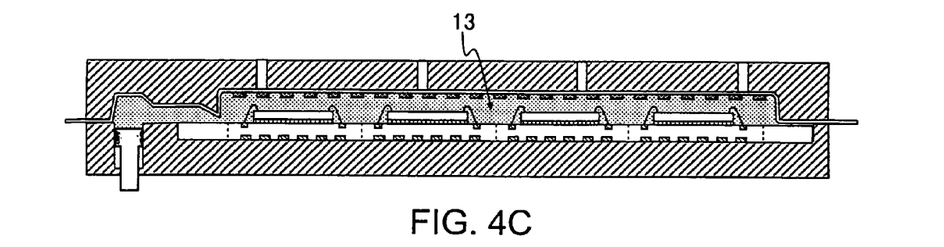

As shown in FIG. 4C, after the molten encapsulating resin has been filled in the cavity 411, the encapsulating resin is cured at 180° C., for example, and hardened so as to form the encapsulating body 13.

Figure 4D:
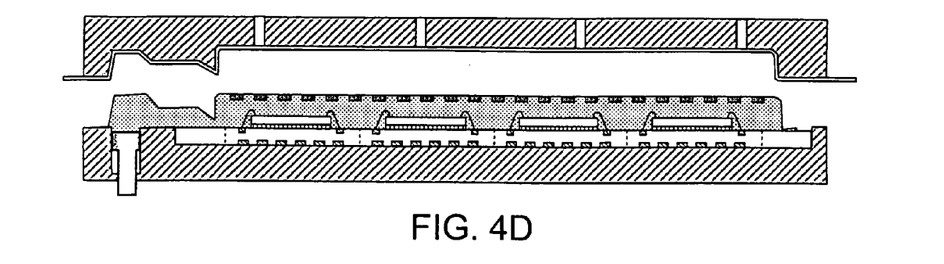

Thereafter, as shown in FIG. 4D, the molds are opened, and the base wiring substrate 31 encapsulated with the resin is removed from the molding tool. The encapsulating body 13 of the base wiring substrate 31 is baked and hardened at a predetermined temperature (e.g., 240° C.). The laminated sheet 44 is removed before the baking. The heat sink plates 14 that have been attached to the laminated sheet 44 are left in the encapsulating body 13 in a state in which they are partially embedded in the encapsulating body 13 so as to have a surface exposed to the exterior of the encapsulating body 13.

Finally, the encapsulating resin is removed from portions corresponding to the cull portion 413 and the liner portion 414. Thus, an intermediate structure as shown in FIG. 3D is obtained.

As described above, an encapsulating process is performed in such a state that the laminated sheet 44 having a plurality of heat sink plates 14 arranged thereon is positioned within the cavity 411 of the molding tool. Therefore, a structure in which a plurality of heat sink plates 14 are embedded in the encapsulating body 13 can be formed efficiently. Furthermore, since the laminated sheet 44 covers the inner surface of the cavity 411, the encapsulating resin is not brought into direct contact with the inner surface of the cavity 411. Therefore, the frequency of cleaning the upper mold 41 can be reduced.

Furthermore, the heat sink plates 14 are attached to the laminated sheet 44 in a state in which they are spaced from each other. Therefore, even if the laminated sheet 44 is extended by heat of molding, the influence on the heat sink plates 14 can be made small. Moreover, since each of the heat sink plates is not affected by other heat sink plates, no distortion is caused in the heat sink plates 14.

As described above, according to the present embodiment, use of a plurality of heat sink plates arranged so as to be spaced from each other can disperse thermal expansion caused by heat during a molding process into individual heat sink plates and can thus prevent generation of distortion. Accordingly, the reliability of a semiconductor device and the manufacturing yield can be improved.

Next, a semiconductor device according to a second embodiment of the present invention will be described with reference to FIG. 5.

Figure 5:
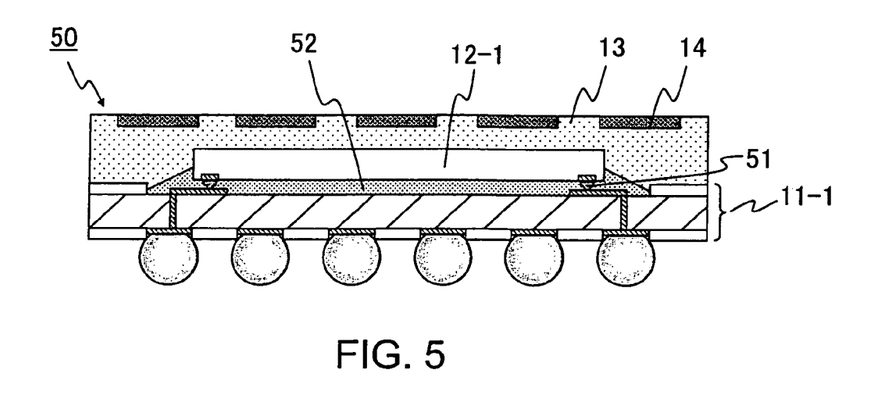
FIG. 5 is a vertical cross-sectional view showing a semiconductor device according to a second embodiment of the present invention.

A semiconductor device 50 shown in FIG. 5 differs from the semiconductor device 10 of the first embodiment in that a semiconductor chip 12-1 is provided on a wiring substrate 11-1 by flip-chip mounting. Specifically, the semiconductor chip 12-1 is electrically connected to the wiring substrate 11-1 by solder bumps 51, rather than the wires 15. Furthermore, an underfill 52 is filled between the semiconductor chip 12-1 and the wiring substrate 11-1.

In the present embodiment, as with the first embodiment, the semiconductor chip 12-1 and the like are encapsulated on the wiring substrate 11-1 by an encapsulating body 13. A plurality of heat sink plates 14 are arranged on one side of the encapsulating body 13 in a state in which they are spaced at predetermined intervals. The heat sink plates 14 are embedded in the encapsulating body 13 so as to have a surface positioned on the same plane.

In the present embodiment, no wires 15 extend upward from the semiconductor chip 12-1. Therefore, the thickness of the encapsulating body 13 can be reduced, and the distance between the semiconductor chip 12-1 and the heat sink plates 14 can be reduced. Thus, heat generated from the semiconductor chip 12-1 can effectively be transferred to the heat sink plates 14, making it possible to improve the thermal radiation capability more effectively than in the first embodiment.

Next, a semiconductor device according to a third embodiment of the present invention will be described with reference to FIG. 6.

Figure 6:
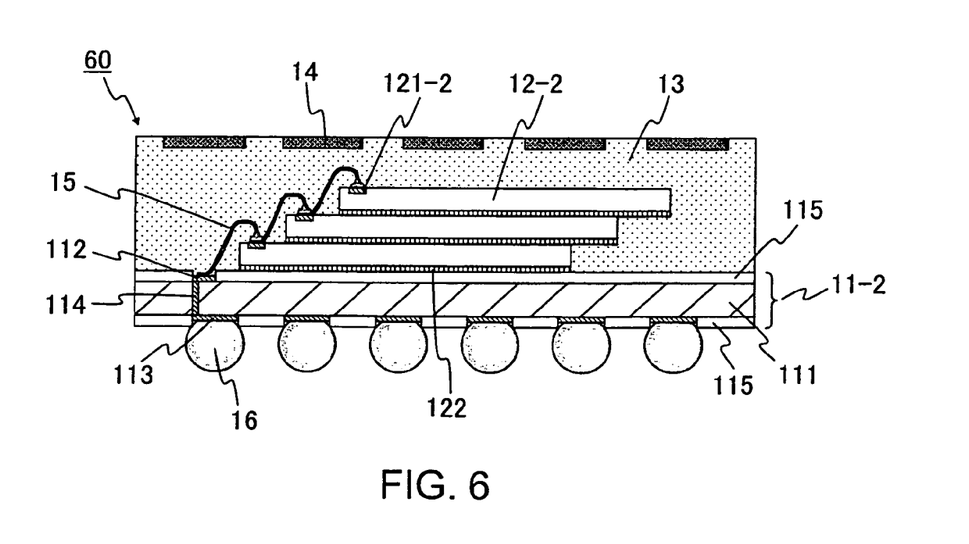
FIG. 6 is a vertical cross-sectional view showing a semiconductor device according to a third embodiment of the present invention.

A semiconductor device 60 shown in FIG. 6 differs from the semiconductor device 10 of the first embodiment in that a plurality of semiconductor chips 12-2 (three semiconductor chips in this example) are stacked on a wiring substrate 11-2 via adhesive members 122.

Each of the semiconductor chips 12-2 has a plurality of electrode pads 121-2 formed along one side of the semiconductor chip 12-2. The semiconductor chips 12-2 are stacked at shifted positions such as to expose those electrode pads 121-2. The corresponding electrode pads 121-2 of adjacent semiconductor chips 12-2 are connected to each other by a wire 15.

In the present embodiment, a plurality of semiconductor chips 12-2 are collectively encapsulated by the encapsulating body 13. As with the first embodiment, a plurality of heat sink plates 14 are arranged on one side of the encapsulating body 13 in a state in which they are spaced at predetermined intervals.

In the present embodiment, since the electrode pads 121-2 of adjacent semiconductor chips 12-2 are connected to each other by the wire 15, the wiring substrate 11-2 can be reduced in size as compared to a configuration in which each of the semiconductor chips 12-2 is connected to the wiring substrate 11-2 by a wire.

The present embodiment assumes that the semiconductor chips 12-2 have the same function like memory chips. Nevertheless, a plurality of semiconductor chips having different functions may be stacked on the wiring substrate 11-2. Furthermore, semiconductor chips having different sizes may be stacked on the wiring substrate 11-2. Moreover, the electrode pads provided on each of the semiconductor chips may be formed along two or more sides of the semiconductor chip.

In any case, the semiconductor device 60 according to the present embodiment can enhance the functionality or increase the capacity. The semiconductor device 60 can also have a thermal radiation capability equivalent to that of the semiconductor device 10 of the first embodiment. Furthermore, the reliability or yield is not decreased by deformation of the heat sink plates.

Next, a semiconductor device according to a fourth embodiment of the present invention will be described with reference to FIG. 7.

Figure 7:
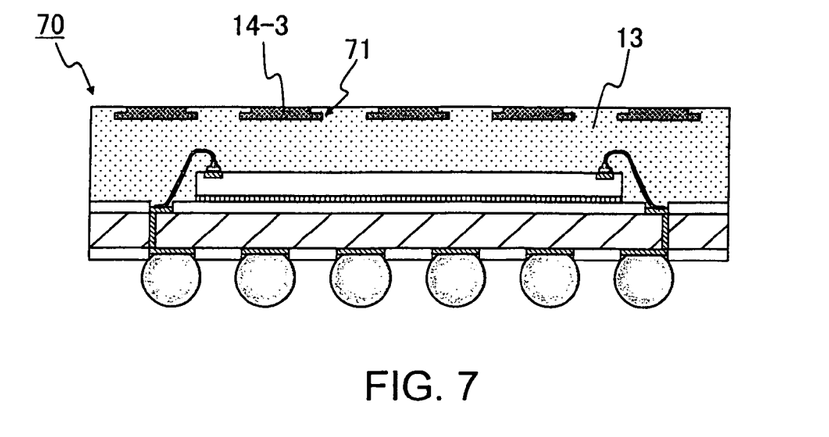
FIG. 7 is a vertical cross-sectional view showing a semiconductor device according to a fourth embodiment of the present invention.

A semiconductor device 70 shown in FIG. 7 differs from the semiconductor device 10 of the first embodiment in that each of heat sink plates 14-3 has protrusions 71.

The protrusions 71 are formed on a surface opposite to an exposed surface of the heat sink plate 14-3. The protrusions 71 extend to the outside of the outer edges of the exposed surface of the heat sink plate 14-3. The protrusions 71 may be formed along the entire circumference of the heat sink plate 14-3 or may be formed along two opposed sides of the heat sink plate 14-3. Alternatively, the protrusions 71 may be formed at part of each side or part of two opposed sides of the heat sink plate 14-3.

Since the heat sink plates 14-3 have the protrusions 71, contact areas of the heat sink plates 14-3 and the encapsulating body 13 are increased so as to improve the adhesiveness between the heat sink plates 14-3 and the encapsulating body 13 and the thermal radiation capability. Furthermore, the shape of the heat sink plates 14-3 can prevent the heat sink plates 14-3 from coming off the encapsulating body 13.

Next, a semiconductor device according to a fifth embodiment of the present invention will be described with reference to FIG. 8.

Figure 8:
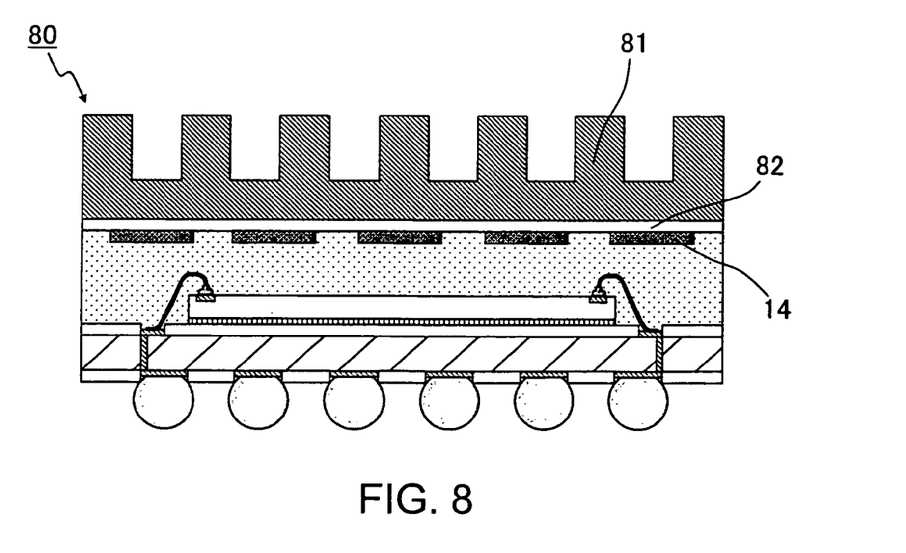
FIG. 8 is a vertical cross-sectional view showing a semiconductor device according to a fifth embodiment of the present invention.

A semiconductor device 80 shown in FIG. 8 differs from the semiconductor device 10 of the first embodiment in that it has heat sink fins 81. For example, the heat sink fins 81 are made of metal, and jointed and fixed to the heat sink plates 14 via a joint layer 82 such as solder.

In the present embodiment, heat from the heat sink plates 14 can be transferred to the heat sink fins 81 via the joint layer 82 and can be radiated externally from the heat sink fins 81, which have a larger surface area than the heat sink plates 14. Therefore, the thermal radiation capability can be increased as compared to the first embodiment.

Although the invention has been described above in connection with several preferred embodiments thereof, it will be appreciated by those skilled in the art that those embodiments are provided solely for illustrating the invention, and should not be relied upon to construe the appended claims in a limiting sense. As a matter of course, many modifications and variations may be made without departing from the spirit of the present invention.

For example, in the above embodiments, the heat sink plates have a rhombus or square shape in the plan view. Nevertheless, the heat sink plates may have any shape such as a rectangular shape, a circular shape, or a polygonal shape. A combination of two or more shapes may be employed to the heat sink plates. In any case, a plurality of individual metal plates are arranged in such a state that they are spaced from each other.

Furthermore, in the above embodiments, the semiconductor device includes the wiring substrate in which a glass epoxy material is used as an insulating material. Nevertheless, the present invention is applicable to a semiconductor device including a flexible wiring substrate in which a polyimide material is used as an insulating material.

Aspects of another embodiment of this invention are described below.

(1) A method of manufacturing a semiconductor device includes:

setting, on a first mold, a support sheet to which a plurality of heat sink plates have been attached in such a state that they are spaced from each other;

setting, on a second mold that forms a molding tool together with the first mold, a substrate on which a semiconductor chip has been mounted;

closing the molding tool so as to oppose the substrate and the plurality of heat sink plates to each other and to form a space into which a molten encapsulating resin is to be injected between the substrate and the plurality of heat sink plates; and injecting the molten encapsulating resin into the space so as to encapsulate the semiconductor chip on the substrate and to integrate the plurality of heat sink plates with the encapsulating resin.

(2) In the method described in above item (1), the setting the support sheet on the first mold includes evacuating a cavity of the first mold so as to bring the support sheet into close contact with an inner surface of the cavity.

What is claimed is:

1. A semiconductor device comprising:
a substrate;
a semiconductor chip mounted on the substrate;
an encapsulating body encapsulating the semiconductor chip on the substrate, the encapsulating body including a top surface and a side surface, the side surface of the encapsulating body being substantially aligned with a side surface of the substrate; and
a plurality of heat sink plates embedded in the encapsulating body, each of the heat sink plates including an upper surface and a lower surface opposite to the upper surface, each of the upper surfaces being exposed from the top surface of the encapsulating body, the heat sink plates being spaced from each other, each of the heat sink plates being spaced from the semiconductor chip by the encapsulating body, and the encapsulating body being in contact with an entire area of each of the lower surfaces of the heat sink plates, the plurality of heat sink plate being electrically isolated from the semiconductor chip,
wherein the encapsulating body comprises an insulating resin, and
wherein at least one of the heat sink plates includes an end part that is terminated with the side surface of the encapsulating body without covering the side surface of the encapsulating body by the end part.

2. The semiconductor device as recited in claim 1, wherein each of the upper surfaces has a rectangular shape, and
the plurality of heat sink plates are arranged two-dimensionally at regular intervals.

3. The semiconductor device as recited in claim 1, wherein each of the plurality of heat sink plates has a protrusion extending to an outside of an outer edge of the upper surface.

4. The semiconductor device as recited in claim 1, wherein the plurality of heat sink plates comprise a metal plate.

5. The semiconductor device as recited in claim 1, further comprising a heat sink fin attached to the plurality of heat sink plates.

6. The device as claimed in claim 1, wherein the plurality of heat sink plates are separated by a plurality of spaces.

7. The semiconductor device as claimed in claim 6, wherein the plurality of spaces comprises a portion of the encapsulating body, the portion including a mesh shape in a plan view.

8. The semiconductor device as recited in claim 1, wherein the surface of the plurality of heat sink plates comprises a surface of a heat sink plate of the plurality of heat sink plates, and
wherein the encapsulating body is formed on a surface of the semiconductor chip which is opposite the substrate, an area of the surface of the semiconductor chip being greater than an area of the surface of the heat sink plate.

9. The semiconductor device as recited in claim 8, wherein the plurality of heat sink plates are separated from the surface of the semiconductor chip by the encapsulating body in a direction perpendicular to the surface of the plurality of heat sink plates.

10. The semiconductor device as recited in claim 8, wherein the plurality of heat sink plates are separated by a plurality of spaces, and the plurality of heat sink plates and the plurality of spaces are separated from the surface of the semiconductor chip by the encapsulating body in a direction perpendicular to the surface of the plurality of heat sink plates.

11. The semiconductor device as recited in claim 8, wherein a heat sink plate of the plurality of heat sink plates comprises plural side surfaces which are formed perpendicular to the surface of the plurality of heat sink plates, and the plural side surfaces are separated from the surface of the semiconductor chip by the encapsulating body in a direction perpendicular to the surface of the plurality of heat sink plates.

12. The semiconductor device as recited in claim 1, wherein the encapsulating resin further comprises an other side surface which is formed opposite the side surface of the encapsulating resin,
wherein the at least one of the heat sink plates comprises a first heat sink plate which includes an end part that is terminated with the side surface of the encapsulating body,
wherein the plurality of heat sink plates further comprises a second heat sink plate which includes an end part that is terminated with the other side surface of the encapsulating body, and wherein the plurality of heat sink plates comprises plural heat sink plates which are formed between the first and second heat sink plates.

13. A semiconductor device comprising:
a semiconductor chip formed on a substrate;
an insulating layer covering the semiconductor chip, the insulating layer including a top surface and a side surface, the side surface of the insulating layer being substantially aligned with a side surface of the substrate; and
a plurality of metal plates embedded in the insulating layer, each of the metal plates including an upper surface and a lower surface opposite to the upper surface, each of the upper surfaces of the metal plates being exposed from the top surface of the insulating layer, and the insulating layer being in contact with an entire area of each of the lower surfaces of the metal plates, the plurality of metal plates being electrically isolated from the semiconductor chip,
wherein at least one of the metal plates includes an end part that is terminated with the side surface of the insulating layer without covering the side surface of the insulating layer by the end part.

14. The semiconductor device as claimed in claim 13, wherein the metal plates are disposed on the insulating layer such that the upper surfaces of the metal plates are substantially coplanar with the top surface of the insulating layer.

15. The semiconductor device as claimed in claim 13, wherein the metal plates are independently disposed with one another.

16. The semiconductor device as claimed in claim 13, wherein the substrate is provided on a bottom surface opposed to the top surface of the insulating layer, the semiconductor chip being disposed between the substrate and the insulating layer.

17. The semiconductor device as claimed in claim 13, wherein each of the upper surfaces of the metal plates has a rectangular shape, and
the metal plates are arranged two-dimensionally at regular intervals.

18. The semiconductor device as claimed in claim 13, wherein each of the metal plates including a protrusion extending from an edge thereof, the protrusion being embedded in the insulating layer.

19. The semiconductor device as claimed in claim 13, further comprising:
a heat sink member provided on the top surface of the insulating layer, the metal plates being coupled to the heat sink member.

20. The device as claimed in claim 13, wherein the plurality of metal plates are separated by a plurality of spaces such that a metal pate of the plurality of metal pates is separated from an other metal plate of the plurality of metal plates by a space of the plurality of spaces.

21. A semiconductor device comprising:
a wiring substrate including a top surface and a plurality of connection pads formed on the top surface;
a first semiconductor chip including a first surface and a plurality of first electrode pads formed on the first surface, and mounted over the top surface of the wiring substrate, the first electrode pads being electrically coupled to corresponding ones of the connection pads of the wiring substrate;
a second semiconductor chip including a second surface and a plurality of second electrode pads formed on the second surface, and stacked over the first semiconductor chip, the second electrode pads being electrically coupled to corresponding ones of the connection pads of the wiring substrate;
an insulating layer provided over the top surface of the wiring substrate to cover the first semiconductor chip and the second semiconductor chip, the insulating layer including an exposed top surface and an exposed side surface, the exposed side surface of the insulating layer being substantially aligned with a side surface of the wiring substrate; and
a plurality of metal plates embedded in the insulating layer such that upper surfaces of the metal plates expose from the exposed top surface, each of the metal plates including a lower surface opposite to the upper surface, and the insulating layer being in contact with an entire area of each of the lower surfaces of the metal plates, the plurality of metal plates being electrically isolated from the first and second semiconductor chips,
wherein at least one of the metal plates includes an end part that is terminated with the exposed side surface of the insulating layer without covering the exposed side surface of the insulating layer by the end part.

22. The semiconductor device as claimed in claim 21, wherein the metal plates are exposed from the top surface of the insulating layer such that the upper surfaces of the metal plates are substantially coplanar with the top surface of the insulating layer.

23. The semiconductor device as claimed in claim 21, wherein the metal plates are independently disposed with one another.

24. The semiconductor device as claimed in claim 21, wherein each of the upper surfaces of the metal plates has a rectangular shape, and
the metal plates are arranged two-dimensionally at regular intervals.

25. The semiconductor device as claimed in claim 21, wherein each of the metal plates includes a protrusion extending from an edge thereof, the protrusion being embedded in the insulating layer.

26. The semiconductor device as claimed in claim 21, further comprising:
a heat sink member provided on the top surface of the insulating layer, the metal plates being coupled to the heat sink member.

* * * * *